(12) United States Patent
Minami et al.

(10) Patent No.: US 6,404,295 B1
(45) Date of Patent: Jun. 11, 2002

(54) VOLTAGE CONTROLLED OSCILLATOR WITH LINEAR INPUT VOLTAGE CHARACTERISTICS

(75) Inventors: Koichiro Minami; Masayuki Mizuno, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/649,047

(22) Filed: Aug. 29, 2000

(30) Foreign Application Priority Data

Sep. 8, 1999 (JP) .......................................... 11-253729

(51) Int. Cl.$^7$ .............................. H03B 5/20; H03B 5/24
(52) U.S. Cl. ..................... 331/57; 331/175; 331/177 R; 331/185
(58) Field of Search ............................. 331/57, 116 R, 331/116 FE, 117 R, 117 FE, 117 D, 143, 144, 175, 177 R, 185

(56) References Cited

U.S. PATENT DOCUMENTS 4,017,686 A * 4/1977 Todd .......................... 179/2 R
5,543,745 A * 8/1996 Notani ........................ 327/538
5,610,426 A * 3/1997 Asai et al. ................... 257/360
5,710,527 A * 1/1998 Yaguchi et al. ................ 331/57
5,783,954 A * 7/1998 Koifman et al. ............. 327/103
5,814,981 A * 9/1998 Tsuchi et al. ................ 323/369
5,896,068 A * 4/1999 Moyal .......................... 331/34

FOREIGN PATENT DOCUMENTS

JP          9-508762        9/1997
JP          9-312521        12/1997

* cited by examiner

*Primary Examiner*—David Mis
(74) *Attorney, Agent, or Firm*—Young & Thompson

(57) ABSTRACT

A voltage controlled oscillator includes a first converter, a second converter and an oscillator. The first converter outputs a first current proportional to an input voltage. In this case, an increase rate of the first current is decreased as the input voltage is increased. The second converter outputs a second current proportional to the input voltage. An increase rate of the second current is increased as the input voltage is increased. The oscillator outputs an oscillation signal in response to a summation of the first current and the second current.

13 Claims, 7 Drawing Sheets

VOLTAGE CONTROLLED OSCILLATOR WITH LINEAR INPUT VOLTAGE CHARACTERISTICS

BACKGROUND OF THE INVENTION

1. Field of the Invention

The present invention relates to a voltage controlled oscillator.

2. Description of the Related Art

Generally, a voltage controlled oscillator is employed in a phase locked loop (PLL) circuit to control the frequency of an oscillation signal. An exemplary circuitry arrangement is shown in FIG. 1. As shown in FIG. 1, when the voltage level at an input terminal 11 is shifted from a first voltage of V to a second voltage V+ΔV, the frequency of the oscillation signal outputted from an output terminal 12 varies from F to F+ΔF.

In the conventional voltage controlled oscillator, the input terminal 11 is connected to the gate of an N-channel MOS (n-channel metal oxide semiconductor) transistor or a P-channel MOS (p-channel metal oxide semiconductor) transistor. Current supplied to a train of inverters is varied to control the oscillation signal frequency.

The frequency of the oscillation signal generated by a train of inverters 14 is proportional to the current flowing through a second P-channel MOS transistor 102. The current flowing through the second P-channel MOS transistor 102 is proportional to the current flowing through a first P-channel MOS transistor 101. The current flowing through the first P-channel MOS transistor 101 is equal to the current flowing through a first N-channel MOS 201. When the voltage at the input terminal 11 is shifted from the ground level to the power supply voltage level, any current does not flow through the first N-channel MOS transistor 201 until the voltage at the input terminal 11 rises up to a threshold voltage of the first N-channel MOS transistor 201.

When the voltage at the input terminal 11 exceeds the threshold voltage of the first N-channel MOS transistor 201, the current flows through the first N-channel MOS transistor 201. As the voltage at the input terminal 11 is increased, the current flowing through the first N-channel MOS transistor 201 increases. However, at this time, the voltage at the first terminal 13 decreases, so that the current is gradually saturated.

FIGS. 2A and 2B show two examples of the inverter 14 used in the above voltage controlled oscillator. FIG. 2A shows an arrangement one inverter. In FIG. 2A, the inverter is provided between the power supply voltage 20 and the ground 21. Reference numerals 22 and 23 denote an input and an output. FIG. 2B shows the inverter composed of an N-channel MOS transistor and a P-channel MOS transistor.

The relation between the input voltage V at the input terminal 11 and the frequency F of the oscillation signal outputted from the voltage controlled oscillator is as shown in FIG. 3. As seen from FIG. 3, the voltage at the input terminal 11 is limited to a range of 0.8 to 2.5 V and the operation frequency range is up to 300 MHz. Also, a ratio ΔF/ΔV increases simply. On contrary, when the input terminal 11 is connected to the gate of the P-channel MOS transistor in the voltage controlled oscillator, the input terminal 11 is similarly limited, and the ratio ΔF/ΔV decreases simply.

It is assumed that when the voltage at the input terminal is varied, the frequency of the oscillation signal outputted from the output terminal changes in a range between the minimum, FMIN and the maximum, FMAX. Also, variations in the performance of the oscillator are derived from deviation in the manufacturing conditions of the oscillator, deviations caused based on change in the operating temperature and deviation caused based on the change of the power supply voltage of the oscillator.

In consideration of all types of the variations of the performance, the best condition is established in a case of a maximum of gain, and the worst condition is established in case of a minimum of gain. The normal condition is established with no deviation between the best condition and the worst condition. In this case, a frequency range between the minimum FMIN and the maximum FMAX is referred to as an operation frequency range. In the conventional voltage controlled oscillator, either or both of FMIN and FMAX of the oscillation frequency are increased or decreased depending on the deviations. Therefore, when the deviations of the performance are large, the operation frequency range becomes narrow.

Recently, a fine pattern technique is applied to the components of an oscillator, and the power supply voltage is decreased. Therefore, the variations of the performance increase so that the operation frequency range is undesirably narrowed. For widening the operation frequency-range, it is necessary to increase the gain ΔF/ΔV where ΔF is a change in the frequency of the oscillation signal outputted from the output terminal and ΔV is a change in the voltage at the input terminal.

However, since the input terminal of the voltage controlled oscillator receives an analog voltage, the increase of the gain may cause the fluctuation or jitter in the period of the oscillation signal outputted from the output terminal.

In conjunction with the above description, a voltage controlled oscillation circuit is disclosed in Japanese Laid Open Patent Application (JP-A-Heisei 9-312521). In this reference, the voltage controlled oscillation circuit is provided to have linear control voltage—oscillation frequency characteristic over a wide range while keeping noise endurance. For this purpose, an input control voltage VC is compensated for by a linear compensating circuit (2) which has a voltage conversion characteristic inverse to the control voltage—oscillation frequency characteristic of the voltage controlled oscillation circuit (3). The oscillation frequency of the voltage controlled oscillation circuit (3) is controlled based on the control voltage V'C obtained by the voltage converting operation.

Also, a voltage controlled oscillator having efficient process compensation is disclosed in Japanese Laid Open Patent Application (JP-A-Heisei 9-508762). In this reference, a voltage controlled oscillator (VCO) circuit gives an output signal having an output frequency with the least change to an optionally predetermined input control voltage regardless of a manufacturing process change, a temperature change and a power supply voltage change. The VCO circuit contains a multi-stage ring oscillator which contains a plurality of current depletion inverters connected in series. The VCO circuit uses a first current source to give a substantially constant current independent from a process change, a temperature change and a power supply voltage change, and a second current source to give a variable current in response to the process change, the temperature change and the power supply voltage change. Both of the current sources generate current signals independent from the input signal to the VCO circuit. An attenuator gives a control current signal to the ring oscillator in response to an input voltage signal from a phase locked loop filter to the VCO circuit. The attenuator receives a supply current signal produced by subtracting the second current signal from the first current signal, and use a difference auxiliary circuit to attenuate the supply current signal in response to an input voltage to generate a control current signal which sets a current level of the cells of the ring oscillator. The oscillation frequency of the ring oscillator is determined based on the control current signal. Moreover, the VCO circuit includes a current mirror circuit to receive the control current signal from the attenuator and to reflect the control current signal to the ring oscillator.

SUMMARY OF THE INVENTION

Therefore, an object of the present invention is to provide a voltage controlled oscillator which can have a wide operation frequency range.

In order to achieve an aspect of the present invention, a voltage controlled oscillator includes a first converter, a second converter and an oscillator. The first converter outputs a first current proportional to an input voltage. In this case, an increase rate of the first current is decreased as the input voltage is increased. The second converter outputs a second current proportional to the input voltage. An increase rate of the second current is increased as the input voltage is increased. The oscillator outputs an oscillation signal in response to a summation of the first current and the second current.

Here, it is desirable that the summation of the first current and the second current increases substantially linearly as the input voltage is increased.

Also, the oscillator desirably outputs the oscillation signal having a frequency proportional to the summation of the first current and the second current.

Also, a voltage range of the input voltage may be substantially from a first threshold voltage of a MOS transistor to (a power supply voltage—a second threshold voltage of another MOS transistor).

Also, the first converter may include a first P-channel MOS transistor and a first N-channel MOS transistor which are connected in series between a power supply voltage and a ground, and a second P-channel MOS transistor connected with the power supply voltage and outputting the first current to the oscillator. The input voltage is supplied to a gate of the first N-channel MOS transistor. The drain and gate of the first P-channel MOS transistor and the gate of the second P-channel MOS transistor are connected with each other.

Also, the second converter may include third and fourth P-channel MOS transistors connected in parallel between the power supply voltage and a common node, a second N-channel MOS transistor connected between the common node and the ground, and a fifth P-channel MOS transistor connected with the power supply voltage and outputting the second current to the oscillator. The gate of the second N-channel MOS transistor is connected to the power supply voltage. Also, the gate of the third P-channel MOS transistor is connected to the input voltage, and the gate of the fourth P-channel MOS transistor is connected with the common node and a gate of the fifth P-channel MOS transistor.

Also, the oscillator may include inverters of an odd number connected in series.

In another aspect of the present invention, a method of generating an oscillation signal is attained by generating a first current proportional to an input voltage, an increase rate of the first current is decreased as the input voltage is increased; by generating a second current proportional to the input voltage, an increase rate of the second current is increased as the input voltage is increased; and by generating an oscillation signal in response to a summation of the first current and the second current.

Here, it is desirable that the summation of the first current and the second current increases substantially linearly.

Also, the oscillation signal desirable has a frequency proportional to the summation of the first current and the second current.

Also, a voltage range of the input voltage may be substantially from a first threshold voltage of a MOS transistor to (a power supply voltage—a second threshold voltage of another MOS transistor).

In order to achieve still another aspect of the present invention, a voltage controlled oscillator include a first converter outputting a first current proportional to an input voltage, a second converter outputting a second current proportional to the input voltage, and an oscillator outputting an oscillation signal in response to a summation of the first current and the second current, the summation increases substantially linearly as the input voltage is increased.

Here, it is desirable that an increase rate of the first current is decreased as the input voltage is increased, and an increase rate of the second current is increased as the input voltage is increased.

Also, the oscillator desirably outputs the oscillation signal having a frequency proportional to the summation of the first current and the second current.

Also, a voltage range of the input voltage may be substantially from a first threshold voltage of a MOS transistor to (a power supply voltage—a second threshold voltage of another MOS transistor).

Also, the first converter may include a first P-channel MOS transistor and a first N-channel MOS transistor which are connected in series between a power supply voltage and a ground, and a second P-channel MOS transistor connected with the power supply voltage and outputting the first current to the oscillator. The input voltage is supplied to a gate of the first N-channel MOS transistor. The drain and gate of the first P-channel MOS transistor and the gate of the second P-channel MOS transistor are connected with each other.

Also, the second converter may include third and fourth P-channel MOS transistors connected in parallel between the power supply voltage and a common node, a second N-channel MOS transistor connected between the common node and the ground, and a fifth P-channel MOS transistor connected with the power supply voltage and outputting the second current to the oscillator. The gate of the second N-channel MOS transistor is connected to the power supply voltage. Also, the gate of the third P-channel MOS transistor is connected to the input voltage, and the gate of the fourth P-channel MOS transistor is connected with the common node and a gate of the fifth P-channel MOS transistor.

Also, the oscillator may include inverters of an odd number connected in series.

In yet still another aspect of the present invention, a method of generating an oscillation signal in a voltage controlled oscillator, is attained by generating a first current proportional to an input voltage; by generating a second current proportional to the input voltage, a summation of the first current and the second current increasing substantially linearly as the input voltage is increased; and by generating an oscillation signal having a frequency proportional to the summation of first current and the second current.

Here, it is desirable that an increase rate of the first current is decreased as the input voltage is increased, and an increase rate of the second current is increased as the input voltage is increased.

Also, a voltage range of the input voltage is substantially from a first threshold voltage of a MOS transistor to (a power supply voltage—a second threshold voltage of another MOS transistor).

DESCRIPTION OF THE PREFERRED EMBODIMENTS

Hereinafter, a voltage controlled oscillator of the present invention will be described below with reference to the attached drawings.

Figure 1:
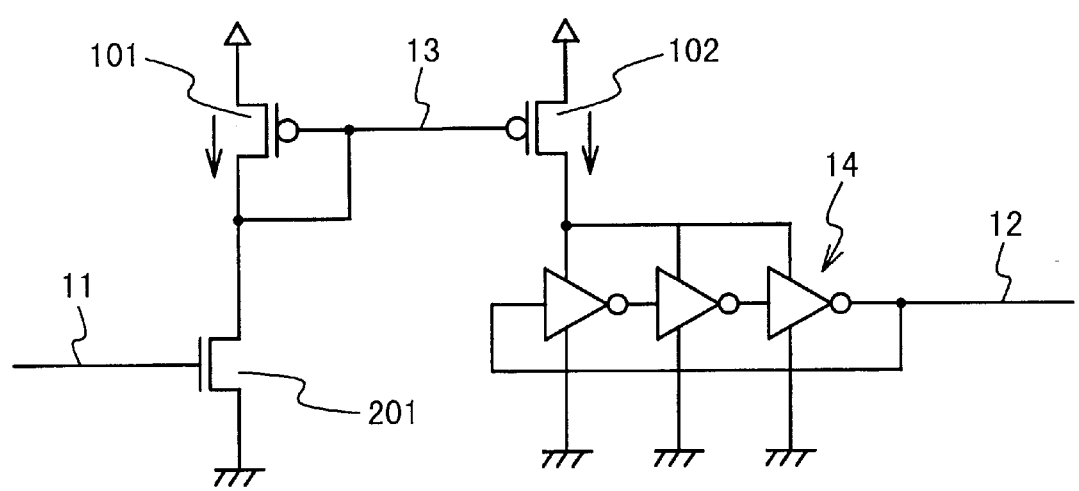
FIG. 1 is a circuit diagram showing the structure of a conventional voltage controlled oscillator.
Figure 2A:
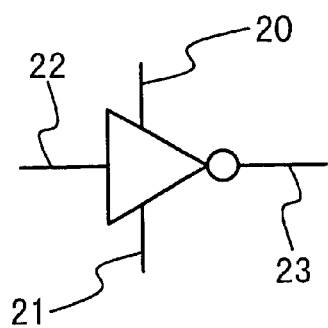
FIGS. 2A and 2B show two examples of the inverter used in the conventional voltage controlled oscillator.
Figure 2B:
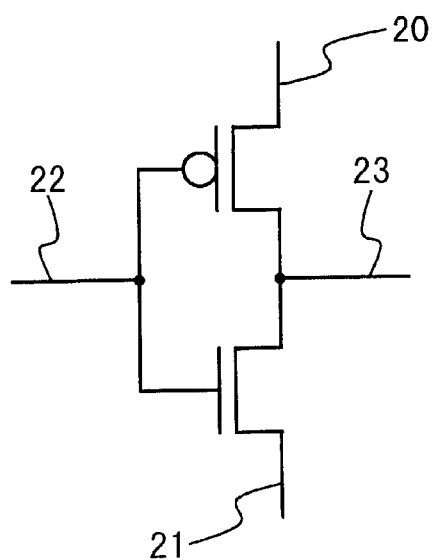
Figure 3:
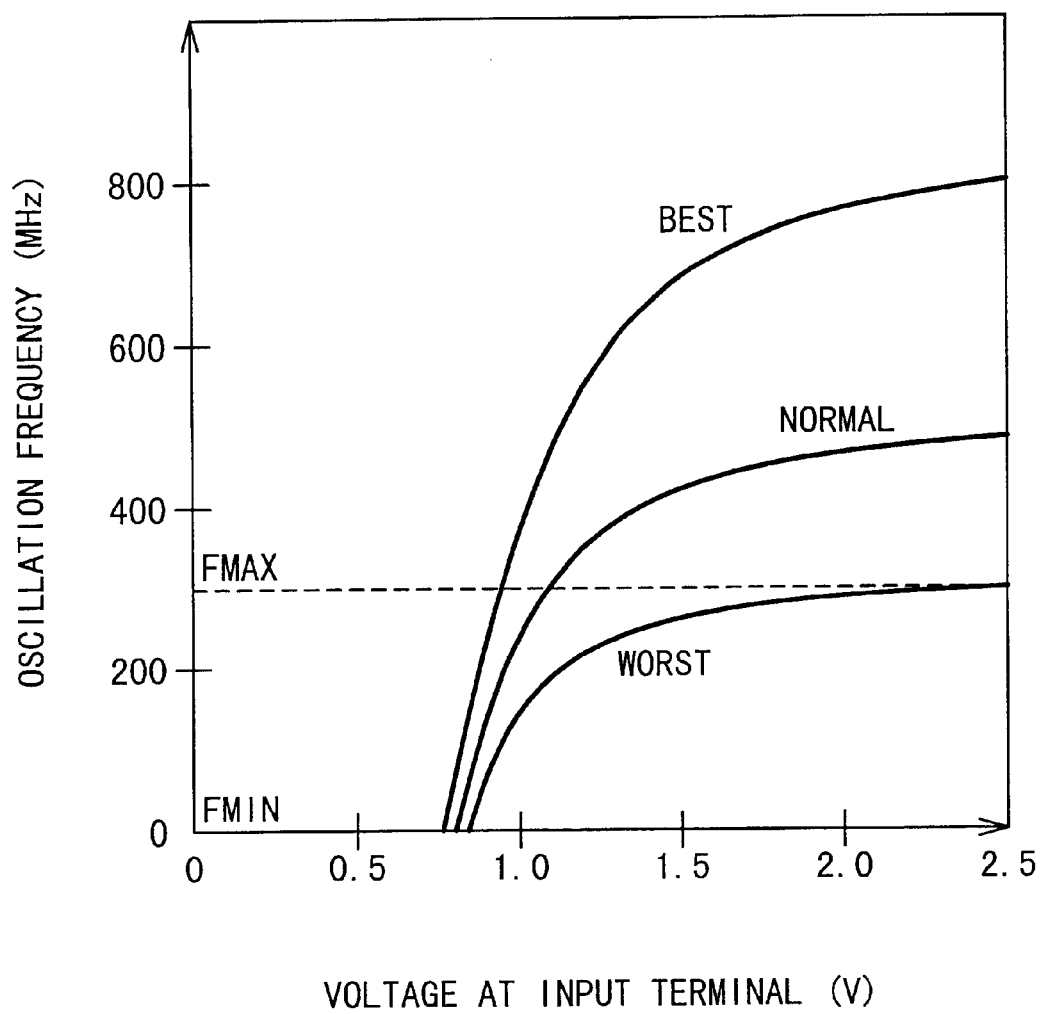
FIG. 3 is a diagram showing the relation between the input voltage V and frequency of the oscillation signal.
Figure 4:
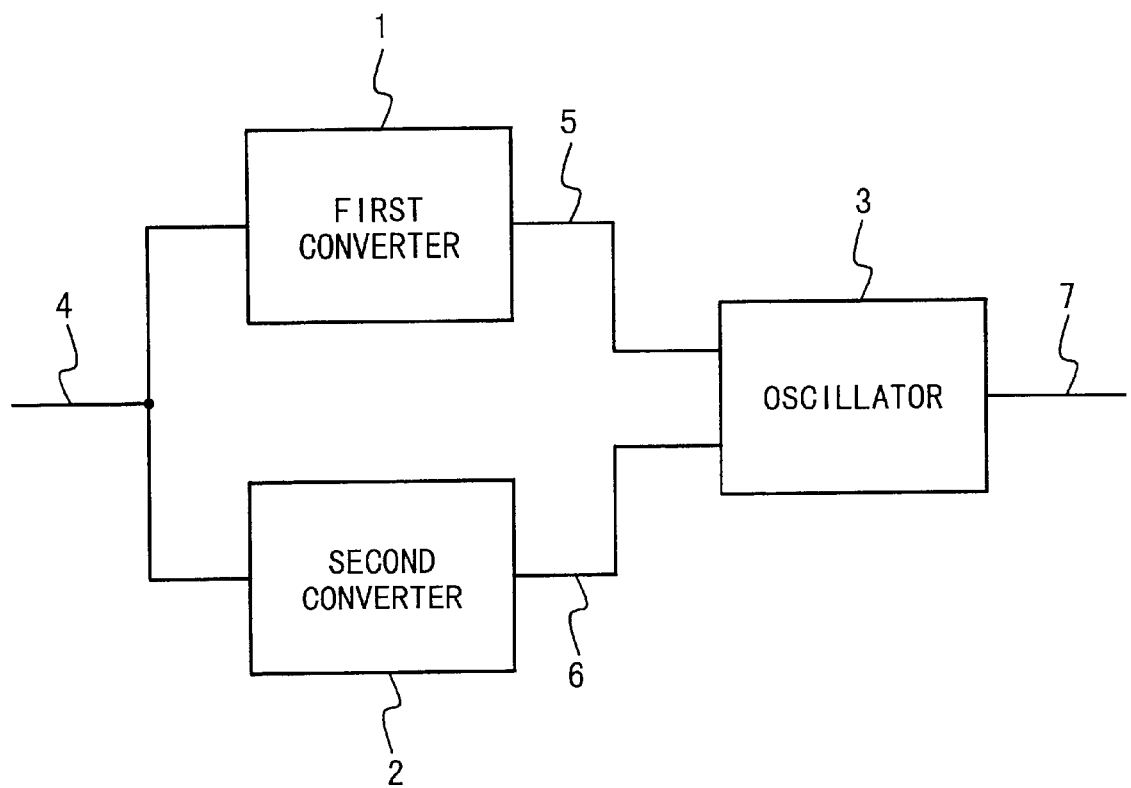
FIG. 4 is a block diagram showing an arrangement of a voltage controlled oscillator according to an embodiment of the present invention.

FIG. 4 is a block diagram showing an arrangement of a voltage controlled oscillator according to an embodiment of the present invention. As shown in FIG. 4, the voltage controlled oscillator according to the embodiment of the present invention is composed of a first converter 1, a second converter 2, and an oscillator 3.

Figure 6:
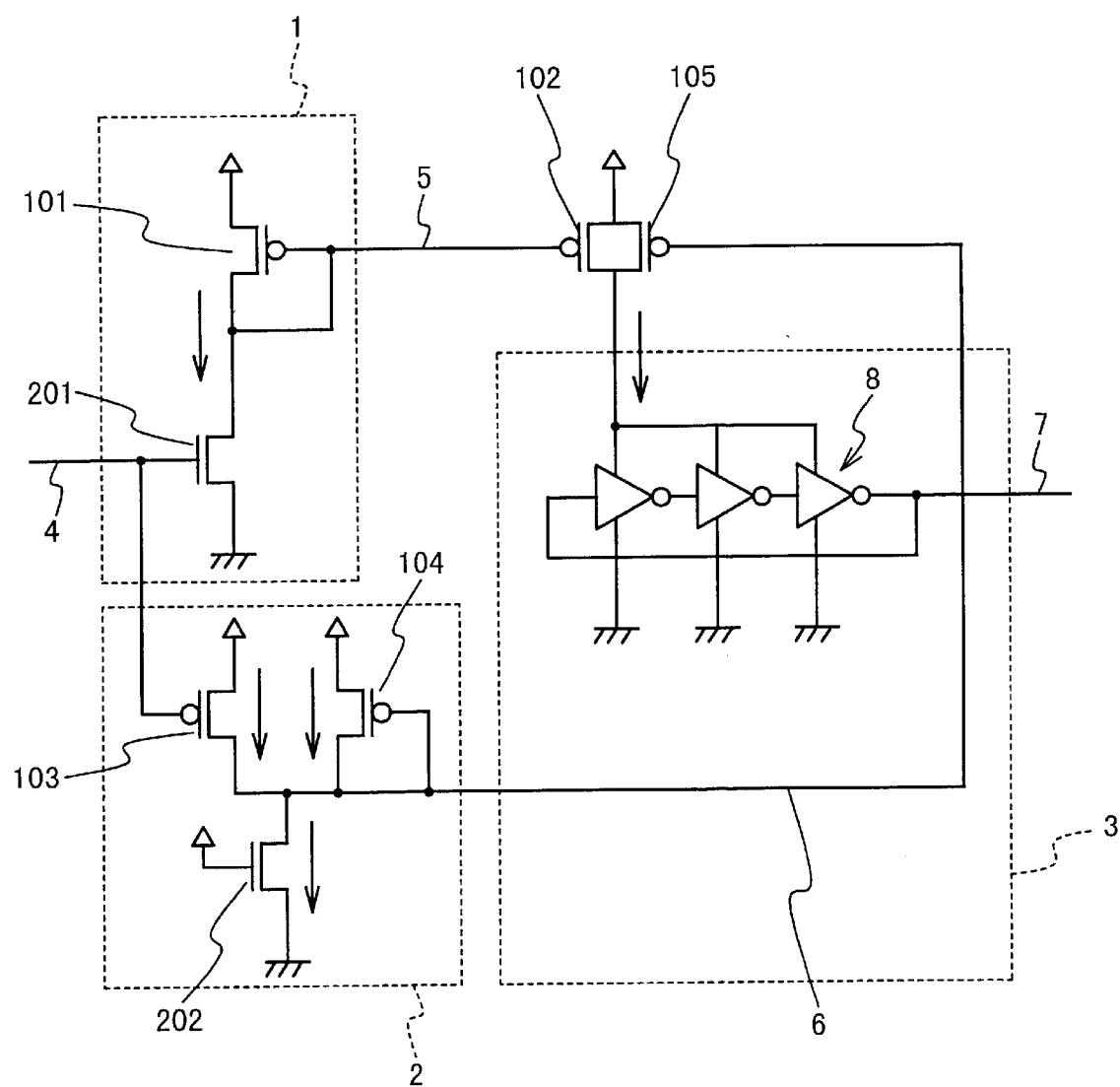
FIG. 6 is a circuit diagram showing the structure of the voltage controlled oscillator according to the embodiment of the present invention.

FIG. 6 is a circuit diagram showing the structure of the voltage controlled oscillator according to the embodiment of the present invention. Referring to FIG. 6, the first converter 1 is composed of a first P-channel MOS transistor 101 and a first N-channel MOS transistor 201 which are connected in series between a power supply voltage and a ground, and a second P-channel MOS transistor 102 connected with the power supply voltage and outputting the first current to the oscillator 3. The input voltage at an input terminal 4 is supplied to the gate of the first N-channel MOS transistor 201. The drain and gate of the first P-channel MOS transistor 101 and the gate of the second P-channel MOS transistor 102 are connected with each other.

Also, the second converter 2 is composed of third and fourth P-channel MOS transistors 103 and 104 connected in parallel between the power supply voltage and a common node 6, a second N-channel MOS transistor 202 connected between the common node 6 and the ground, and a fifth P-channel MOS transistor 105 connected with the power supply voltage and outputting the second current to the oscillator 3. The gate of the second N-channel MOS transistor 202 is connected to the power supply voltage. Also, the gate of the third P-channel MOS transistor 103 is connected to the input voltage at the input terminal 4, and the gate of the fourth P-channel MOS transistor 104 is connected with the common node 6 and the gate of the fifth P-channel MOS transistor 105.

Also, the oscillator 3 is composed of a train of inverters 8 of an odd number connected in series. The train of inverters 8 is connected to the drain of the second and fifth P-channel MOS transistors 102 and 105. In the oscillator 3, the frequency of the oscillation signal outputted from an output terminal 7 is varied based on the first current from the converter 1 and second current from the converter 2.

In the voltage controlled oscillator of the present invention, the converter 1 has an increase rate of the first current is decreased as said input voltage is increased. The converter 2 has an increase rate of said second current is increased as said input voltage is increased. Thus, a summation of the first current and the second current increases substantially linearly as the input voltage is increased. Therefore, the oscillator 3 has a wide operation frequency range without increase of a gain regardless of variations of the performance.

Figure 5:
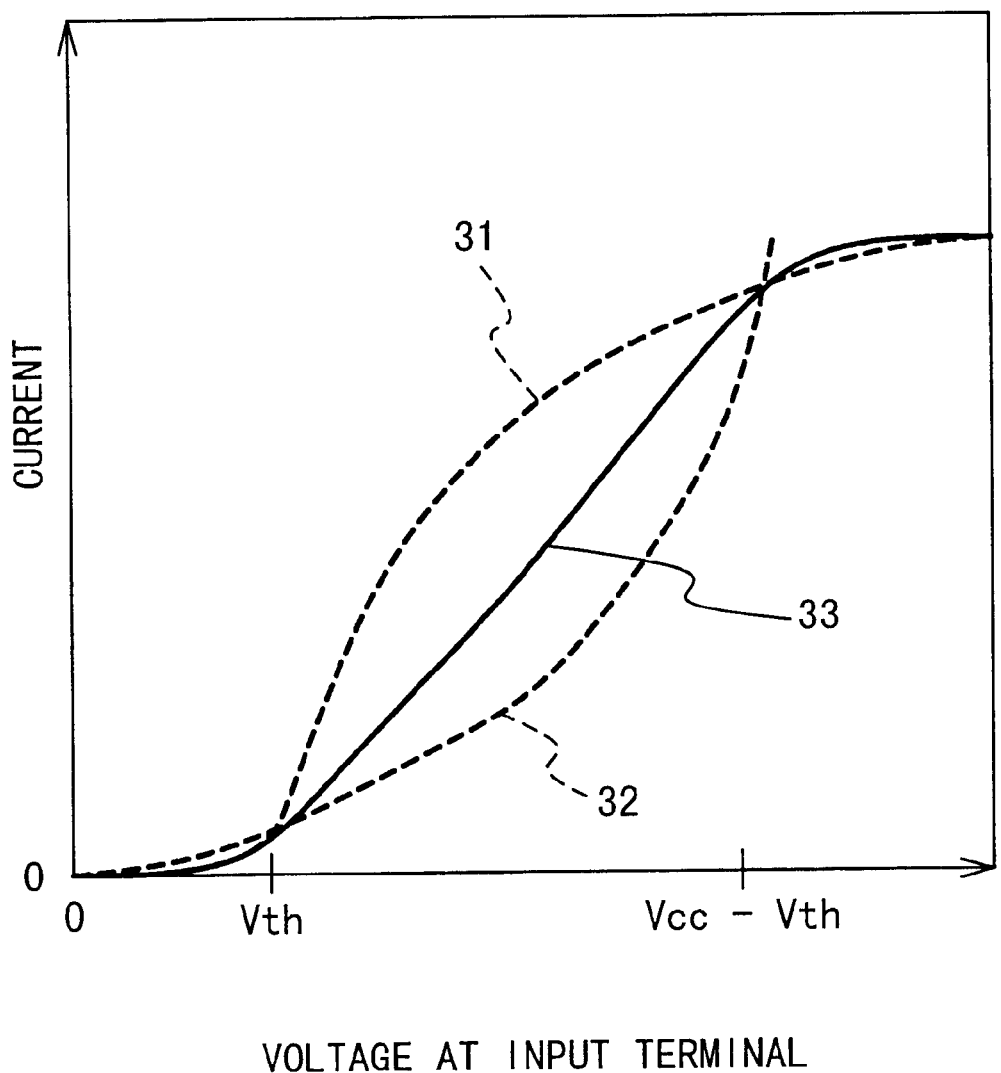
FIG. 5 is a schematic diagram showing an operational characteristic of the voltage controlled oscillator according to the embodiment of the present invention.

FIG. 5 is a schematic diagram showing an operational characteristic of the voltage controlled oscillator according to the embodiment of the present invention. In FIG. 5, the I-V characteristics 31 and 32 of the N-channel MOS transistor and P-channel MOS transistor are moved and drawn in the same quadrant and their summed current 33 is shown. Referring to FIGS. 4 and 5, the operational characteristic of the voltage controlled oscillator of the embodiment of the present invention will be described in more detail.

It is supposed that the voltage at the input terminal 4 is increased from the ground voltage to the power supply voltage. In this case, the current starts to flow in the first converter 1 at the time when the voltage exceeds the threshold voltage of the first N-channel MOS transistor 201. Subsequently, the current increases rapidly and then is saturated as the voltage at the input terminal 4 is increased. Similarly, it is supposed that the voltage at the input terminal 4 is increased from the ground voltage to the power supply voltage. In this case, the current in the second converter 2 sufficiently flows at the time when the voltage is at the ground voltage. Subsequently, the current decreases rapidly as the voltage at the input terminal 4 is increased. When the voltage exceeds the voltage of (power supply voltage— threshold voltage of the third P-channel MOS transistor 103), the current is not flowed.

The I-V characteristic has a substantially linear portion when the current in the converter 1 and the current in the second converter 2 are summed. As a result, the operation frequency range can be widened without increasing the gain, since the oscillation signal frequency is proportional to the current fed to the train of inverters 8.

Next, an operation of the voltage controlled oscillator will be described below with reference to FIG. 6.

Referring to 6, the current flowing through the P-channel MOS transistor 101 is defined by the N-channel MOS transistor 201. The current flowing through the N-channel MOS transistor 201 increases gradually and then rapidly, when the input voltage is increased. Therefore, the current flowing through the P-channel MOS transistor 101 increases similarly. As a result, the current flowing through the P-channel MOS transistor 102 is proportional to the current flowing through the P-channel MOS transistor 101.

Also, the N-channel MOS transistor 202 flows a constant current. The current flowing through the P-channel MOS transistor 104 and the current flowing through the P-channel MOS transistor 103 is equal to the current flowing through the N-channel MOS transistor 202. When the input voltage at the input terminal 4 is increased, the current flowing through the P-channel MOS 103 decrease rapidly and then gradually. Therefore, the current flowing through the P-channel MOS 104 increases rapidly and then gradually. The current flowing through the P-channel MOS 105 is proportional to the current flowing through the P-channel MOS 104.

The current flowing through the P-channel MOS 102 and the current through the P-channel MOS 105 are supplied to the oscillator 3. Since the current flowing through the P-channel MOS 102 increases gradually and rapidly and the current through the P-channel MOS 105 increases rapidly and gradually, the summing current to the oscillator 3 would increases substantially linearly.

The train of inverters 8 changes the oscillation signal frequency in response to the summing current. This widens the operation frequency range without increasing a gain.

Figure 7:
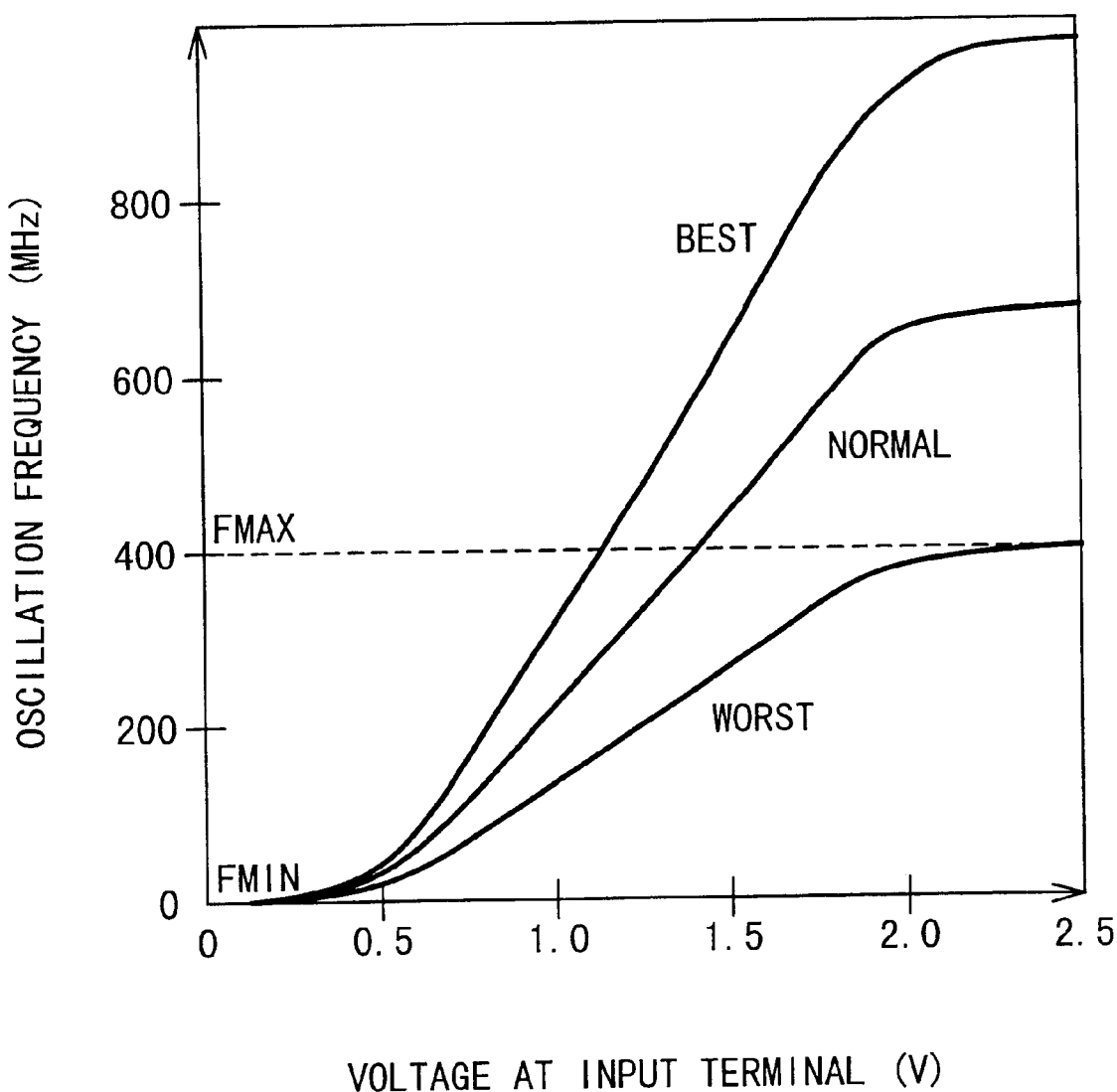
FIG. 7 is a diagram showing an operational characteristic of the voltage controlled oscillator in this embodiment.

FIG. 7 is a diagram showing an operational characteristic of the voltage controlled oscillator in this embodiment. Referring to FIGS. 6 and 7, the operational characteristic of the voltage controlled oscillator of this embodiment will be described below.

For example, the voltage controlled oscillator of the present invention is designed for the power supply voltage of 2.5 volts. In this case, as compared with a conventional voltage controlled oscillator in consideration to the variations of the performance, the voltage range at the input terminal is widened to a range from 0 V to 2.5 V. Also, the operation frequency range is widened to a range from 0 MHz to 400 MHz. In this case, since the maximum of the gain is not increased so that the operation frequency range can be widened without increasing jitter.

Although the present invention is described above using the embodiments, it would be understood that the present invention is not limited to the above embodiment and various modifications are possible within the scope of the present invention.

As set forth above, according to the present invention, in a voltage controlled oscillator, when the input voltage at its input terminal is changed, the frequency of the oscillation signal outputted from its output terminal varies. In this case, a linearly increasing current is supplied from the first and second converters to the oscillator. The linearly increasing current is a summation of the current outputted from the first converter and the current outputted from the second converter. Therefore, the operation frequency range of the voltage controlled oscillator can be widened without increasing a gain regardless of variations of the performance.

What is claimed is:

1. A voltage controlled oscillator comprising:
a first converter outputting a first current in response to an input voltage, a rate of increase of said first current is continuously decreased as said input voltage is increased above a first threshold voltage of a MOS transistor and below an upper voltage;
a second converter outputting a second current in response to said input voltage, a rate of increase of said second current is continuously increased as said input voltage is increased above the first threshold voltage and below the upper voltage;
an oscillator outputting an oscillation signal in response to a summation of said first current and said second current; and wherein said first converter includes:
a first P-channel MOS transistor and a first N-channel MOS transistor which are connected in series between a power supply voltage and a ground;
a second P-channel MOS transistor connected with said power supply voltage and outputting said first current to said oscillator, and
wherein said input voltage is supplied to a gate of said first N-channel MOS transistor, and
a drain and gate of said first P-channel MOS transistor and a gate of said second P-channel MOS transistor are connected with each other.

2. The voltage controlled oscillator according to claim 1, wherein said summation of said first current and said second current increases substantially linearly as said input voltage is increased.

3. The voltage controlled oscillator according to claim 1, wherein said oscillator outputs said oscillation signal having a frequency proportional to said summation of said first current and said second current.

4. The voltage controlled oscillator according to claim 1, wherein a voltage range of said input voltage is substantially from the first threshold voltage of a MOS transistor to the upper voltage that is a power supply voltage minus a second threshold voltage of another MOS transistor.

5. The voltage controlled oscillator according to claim 1, wherein said second converter includes:
third and fourth P-channel MOS transistors connected in parallel between a power supply voltage and a common node;
a second N-channel MOS transistor connected between said common node and a ground; and
a fifth P-channel MOS transistor connected to said power supply voltage and outputting said second current to said oscillator, and
wherein a gate of said second N-channel MOS transistor is connected to said power supply voltage,
a gate of said third P-channel MOS transistor is connected to said input voltage, and
a gate of said fourth P-channel MOS transistor is connected to said common node and a gate of said fifth P-channel MOS transistor.

6. The voltage controlled oscillator according to claim 1, wherein said oscillator includes inverters of an odd number connected in series.

7. A voltage controlled oscillator comprising:
a first converter outputting a first current in response to an input voltage;
a second converter outputting a second current in response to said input voltage; and
an oscillator outputting an oscillation signal in response to a summation of said first current and said second current, said summation increases substantially linearly as said input voltage is increased,
wherein said second converter includes:
first and second P-channel MOS transistors connected in parallel between a power supply voltage and a common node;
a first N-channel MOS transistor connected between said common node and a ground; and
a third P-channel MOS transistor connected to said power supply voltage and outputting said second current to said oscillator, and
wherein a gate of said first N-channel MOS transistor is connected to said power supply voltage,
a gate of said first P-channel MOS transistor is connected to said input voltage, and a gate of said second P-channel MOS transistor is connected with said common node and a gate of said third P-channel MOS transistor.

8. The voltage controlled oscillator according to claim 7, wherein a rate of increase of said first current is continuously decreased as said input voltage is increased, and a rate of increase of said second current is continuously increased as said input voltage is increased.

9. The voltage controlled oscillator according to claim 7, wherein said oscillator outputs said oscillation signal having a frequency proportional to said summation of said first current and said second current.

10. The voltage controlled oscillator according to claim 7, wherein a voltage range of said input voltage is substantially from a first threshold voltage of a MOS transistor to (a power supply voltage—a second threshold voltage of another MOS transistor).

11. The voltage controlled oscillator according to claim 7, wherein said first converter includes:

a fourth P-channel MOS transistor and a second N-channel MOS transistor which are connected in series between said power supply voltage and said ground; and a fifth P-channel MOS transistor connected with said power supply voltage and outputting said first current to said oscillator, and wherein said input voltage is supplied to a gate of said second N-channel MOS transistor, a drain and gate of said fourth P-channel MOS transistor and a gate of said fifth P-channel MOS transistor are connected with each other.

12. The voltage controlled oscillator according to claim 7, wherein said oscillator includes inverters of an odd number connected in series.

13. A voltage controlled oscillator comprising:

a first converter outputting a first current in response to an input voltage, wherein a rate of increase of the first current decreases as the input voltage increases;

a second converter outputting a second current in response to the input voltage, wherein a rate of increase of the second current increases as the input voltage increases; and an oscillator outputting an oscillation signal in response to a sum of the first and second currents, said second converter comprising, first and second P-channel MOS transistors connected in parallel between a power supply voltage and a common node, a first N-channel MOS transistor connected between said common node and a ground, and a third P-channel MOS transistor connected to said power supply voltage and outputting the second current to said oscillator, wherein a gate of said first N-channel MOS transistor is connected to said power supply voltage, a gate of said first P-channel MOS transistor is connected to said input voltage, and a gate of said second P-channel MOS transistor is connected to said common node and to a gate of said third P-channel MOS transistor.

* * * * *